United States Patent [19]

Naito

[11] Patent Number: 5,373,277

[45] Date of Patent: Dec. 13, 1994

[54] SIGNAL DISCRIMINATOR

[75] Inventor: Akira Naito, Sagamihara, Japan

[73] Assignee: Mitsubishi Denki Kabushiki Kaisha, Tokyo, Japan

[21] Appl. No.: 922,495

[22] Filed: Jul. 31, 1992

[30] Foreign Application Priority Data

Aug. 7, 1991 [JP] Japan ................... 3-198065
Aug. 16, 1991 [JP] Japan ................... 3-205989
Aug. 16, 1991 [JP] Japan ................... 3-205990

[51] Int. Cl.$^5$ ............... H01F 17/06; H01F 27/02; H01F 27/26
[52] U.S. Cl. ........................ 336/92; 174/521; 174/92; 324/127; 333/12; 336/175; 336/212
[58] Field of Search ............... 336/174, 175, 176, 92, 336/210, 212, 90; 324/167; 174/52.1, 92, 138 F; 333/81 R, 12, 182, 183, 243

[56] References Cited

U.S. PATENT DOCUMENTS 4,825,185  4/1989  Matsui ...................... 336/175

FOREIGN PATENT DOCUMENTS 4016809 12/1990 Germany ................... 336/176
61-116021 7/1986 Japan ...................... 336/175
61-129475 8/1986 Japan ...................... 336/176
63-268304 11/1988 Japan .
2-140808 11/1990 Japan .

*Primary Examiner*—Thomas J. Kozma
*Attorney, Agent, or Firm*—Oblon, Spivak, McClelland, Maier & Neustadt

[57] ABSTRACT

A signal discriminator comprising:
   a plurality of sets of dual divided magnetic cores having different characteristics;
   a case made of a synthetic resin having a hinge capable of opening and closing the case and a latch means, of which inner portion is divided into sections by a plurality of partition plates, said sections respectively accommodating the plurality of sets of dual divided magnetic cores; and
   press-contacting means interposed and retained between the case and the plurality of sets of dual divided magnetic cores, which press the plurality of sets of dual divided magnetic cores when the case is closed and latched by the latch means, thereby uniformly press-contacting respective divided faces of the plurality of sets of dual divided magnetic cores.

1 Claim, 10 Drawing Sheets

SIGNAL DISCRIMINATOR

BACKGROUND OF THE INVENTION

1. Field of the Invention

This invention relates to a signal discriminator utilized as a device for preventing noise emitted from wirings inside and outside of electronic devices.

This invention relates to a signal discriminator for absorbing noise transmitted from electronic devices or introduced into the electronic devices through a cable and discriminating necessary signals, utilizing a magnetic core having a closed magnetic path composed of divided magnetic cores divided in a plural number.

This invention relates to a signal discriminator utilized for preventing noise in electronic devices.

2. Discussion of the Background

FIG. 5 shows an as attached appearance perspective view of a first conventional example of a signal discriminator. In FIG. 5, reference numerals 1 and 1A designate cases made of a synthetic resin capable of opening and closing, 2 and 2A, two sets of dual divided magnetic cores respectively having different characteristics, and 11, a wire attached to the signal discriminators 10 and 10A.

In the above construction, a composite effect in noise attenuation is obtained as shown in a noise attenuation characteristic diagram of FIG. 4 by utilizing the magnetic cores 2 and 2A having different characteristics. Assuming that the magnetic core 2 is provided with the noise attenuation characteristic as shown by a curve X in FIG. 4, and the magnetic core 2A is provided with the noise attenuation characteristic as shown by a curve Y, the composite noise attenuation characteristic synthetically becomes as shown in a curve Z in the arrangement of the magnetic cores 2 and 2A in FIG. 5, which can handle a wide band noise.

In the first conventional system, as stated above, a plurality of signal discriminators should be provided respectively and separately on the same wire corresponding with the wide band noise. Accordingly, attaching and handling thereof are complex and take much time and labor. Furthermore, the attached portions become long which is a disadvantage in appearance.

On the other hand, the signal discriminator is generally used as an electric noise absorbing member for preventing electromagnetic noise hazard.

FIG. 12 is a sectional diagram showing a second conventional signal discriminator as shown, for instance, in Japanese Unexamined Patent Publication No. 172197/1987, Japanese Unexamined Patent Publication No. 115/1990 and the like. In FIG. 12, a reference numeral 101 designates a signal discriminator, attached to an attaching hole 103 of a panel 102 and a cable 105 passes through a hole 104 thereof. The signal discriminator 101 is composed of a ring-like main body of the signal discriminator 106 attached to the attaching hole 103, a ring-like magnetic core 107 incorporated in the main body of the signal discriminator 106, and a ring-like fixing member 110 attached to the periphery of an inserting portion 109 so that it interposes the panel 102 between a flange 108 of the main body of the signal discriminator 106 and it.

In the signal discriminator 101 the main body of the signal discriminator 106 is attached to the attaching hole 103 of the panel 102, in a state wherein the cable 105 passes through an inner hole 104 of the main body of the signal discriminator 106. The ring-like fixing member 110 is attached and secured by an adhesive, to the outer periphery of the inserting portion 109. In the signal discriminator 101 attached as above, the magnetic core 107 absorbs noise flowing in the cable 105 and discriminates necessary signals.

In the above conventional signal discriminator 101, it is necessary to arrange the main body of the signal discriminator 106 and the ring-like fixing member 110 previously at both sides of the panel 102, and passes the cable 105 therethrough. Accordingly, at every time for exchanging the magnetic core 107, it becomes necessary to remove the cable 105.

Furthermore, in Japanese Unexamined Utility Model Publication No. 91315/1990, a signal discriminator is proposed wherein divided magnetic cores divided in a plural number are accommodated in a case capable of opening and closing thereof composed of divided cases and which is attached to a cable by integrating it so as to surround the outer peripheral portion of the cable.

However, in such a signal discriminator, a means for fixing the signal discriminator to the cable, is necessary and a bush is separately necessary for a cable penetrating portion of a panel.

FIGS. 18 through 21 are respectively perspective construction views of a third through a sixth conventional signal discriminator which are generally and widely in use. In FIG. 18, a reference numeral 201 designates a case made of a synthetic resin capable of opening and closing and having a latch mechanism, 202, a square magnetic core (hereinafter, core) divided in two, 210, a signal discriminator, and 211, a cable. In FIGS. 19 through 21, reference numeral 212 designates a synthetic resin mold inserted with a sleeve-like core 220 or sleeve-like cores 220a and 220b having different characteristics, and 213, a thermally contractive tube covering cores 220a and 220b.

The above constructed signal discriminators are utilized to prevent noise emitted from wirings inside and outside of electronic devices. Generally, when it is mounted in a later step, the case system capable of opening and closing as shown in FIG. 18 is adopted. Furthermore, when it is mounted in an early step, the integrally forming system of FIG. 19 is adopted.

Furthermore, to promote the signal discriminating effect, a plurality of magnetic cores having different characteristics (or the same characteristic), for instance two magnetic cores 220a and 220b shown in FIGS. 20 and 21, are utilized, and the integrated forming of FIG. 20 or the simplified forming system which performs the forming by the thermally contractive tube of FIG. 21, is in use.

Since the third through the sixth conventional signal discriminators are composed as above, the case system capable of opening and closing and mountable in a later step is low in commercial value thereof with respect to the shape. Specifically the integrated forming system is devoid of attachability and detachability, requires time, labor, and equipment in forming thereof, the longitudinal dimension thereof is elongated with respect to the shape, which induces lowering of the signal discriminating efficiency. Furthermore, in the system utilizing a plurality of magnetic cores, there are various problems associated with formation, commercial value, and the handling thereof.

SUMMARY OF THE INVENTION

It is an object of the present invention to solve the above problems of the conventional examples. It is an object of the present invention to provide a signal discriminator having a wide band capable of attaching plural sets of magnetic cores simultaneously to a cable by utilizing the same case.

It is an object of the present invention to provide a signal discriminator having a function of a bush, capable of attaching and exchanging the signal discriminator, even in a state wherein a wire penetrates a panel, capable of attaching the signal discriminator and press-contacting the divided magnetic cores by merely fixing a fixing member, and capable of changing a press-contacting force of the divided magnetic cores in accordance with the electromagnetic characteristic of the magnetic core.

It is an object of the present invention to provide a signal discriminator which is extremely easy in attaching and detaching thereof, which is high in commercial value, and excellent for discriminating a signal from noise.

According to a first aspect of the present invention, there is provided a signal discriminator comprising:
 a plurality of sets of dual divided magnetic cores having different characteristics;
 a case made of a synthetic resin having a hinge capable of opening and closing the case and a latch means, of which an inner portion is divided into sections by a plurality of partition plates, said sections respectively accommodating the plurality of sets of dual divided magnetic cores; and
 press-contacting means interposed and retained between the case and the plurality of sets of dual divided magnetic cores, which press the plurality of sets of dual divided magnetic cores when the case is closed and latched by the latch means, thereby uniformly press-contacting respective divided faces of the plurality of sets of dual divided magnetic cores.

According to a second aspect of the present invention, there is provided a signal discriminator according to the first aspect, wherein the latch means is provided with a latch construction whereby the plurality of sets of dual divided magnetic cores can respectively be exchanged with a plurality of second sets of dual divided magnetic cores having required characteristics when the plurality of sets of dual divided magnetic cores having different characteristics, is utilized.

According to a third aspect of the present invention, there is provided a signal discriminator comprising:
 a plurality of sets of divided magnetic cores divided along an axial line which form a magnetic core surrounding a peripheral portion of a cable when the plurality of sets of divided magnetic cores are integrated;
 a case capable of opening and closing, composed of a plurality of divided cases for accommodating the plurality of sets of divided magnetic cores;
 a plurality of press-contacting members arranged between the plurality of sets of divided magnetic cores and the case for mutually press-contacting divided faces of the plurality of sets of divided magnetic cores;
 an inserting portion formed at one side of the plurality of divided cases, and inserted to an attaching hole of a panel in an integrated state thereof thereby surrounding the peripheral portion of the cable; and
 a fixing member attached to the inserting portion from a side of the panel opposite to the case for press-contacting the divided faces of the plurality of sets of divided magnetic cores and fixing the case to the panel when the plurality of divided cases are closed.

According to a fourth aspect of the present invention, there is provided a signal discriminator for discriminating signal from noise comprising;
 a case made of a synthetic resin provided with a hinge capable of opening and closing the case and a latch means;
 a set of dual divided magnetic cores formed in a spindle shape and accommodated in the case; and
 press-contacting means interposed and retained between the case and the set of dual divided cores for press-contacting divided faces of the set of dual divided cores by pressing the set of dual divided cores accommodated in the case when the case is closed and latched by the latch means.

According to a fifth aspect of the present invention, there is provided a signal discriminator according to the fourth aspect, wherein the set of dual divided magnetic cores formed in a spindle shape is further divided in a longitudinal direction thereof into a plurality of sets of dual divided magnetic cores, both end ones thereof formed in a semi-spindle shape, and the press-contacting means press-contacts respective divided faces of the plurality of sets of dual divided magnetic cores by pressing the plurality of respective sets of dual divided magnetic cores.

In the signal discriminators according to the first and the second aspects of this invention, when the case is closed and latched by the latch means, the press-contacting means uniformly press-contact the divided faces of the magnetic cores, the magnetic cores having different characteristics provided in the same synthetic resin case, performing always stable signal discrimination, and enabling an effective signal discrimination against a wide band noise, by a composite effect accompanied by the series of magnetic cores having different characteristics.

In the signal discriminator according to the third aspect of the present invention, when the case is closed surroundingly around the outer peripheral portion of the cable, in a state wherein the divided magnetic cores and the press-contacting members are accommodated in the divided cases, the divided magnetic cores are integrated surroundingly around the cable, thereby forming the magnetic core.

At this occasion, when the inserting portion integrated surroundingly around the cable, is inserted into the attaching hole of the panel, the divided cases are fixed to the panel in a state wherein they are integrated. In this way, the divided faces of the divided magnetic cores are press-contacted, forming a closed magnetic path, and at the same time, the signal discriminator is attached to the panel.

When current is flown in the cable in this state, the noise component is removed and the necessary signal is discriminated in accordance with the impedance characteristic of the magnetic core. The smaller the gap between the divided faces of the divided magnetic cores, the larger the noise removing effect. Accordingly, the press-contacting force can be changed by changing the press-contacting members in accordance with the electromagnetic characteristic required for the magnetic core.

The exchange of the divided magnetic cores and/or the press-contacting part, can be performed by removing the signal discriminator by the operation which is reverse to the above operation, and re-attaching thereof is performed by the operation the same with the aforementioned.

In the signal discriminators according to the fourth and the fifth aspects of the present invention, the spindle-shaped dual divided magnetic cores are accommodated in the case by the hinge and the latch means provided in the synthetic resin case capable of opening and closing, the cable is inserted into the magnetic core, the case is closed, and the case is latched by the latch means. In this way, the press-contacting means which are interposed and retained between the case and the magnetic core, uniformly press-contacts the divided faces of the magnetic cores, and always applies a stable press-contacting force on the divided faces. Accordingly, owing to the spindle shape of the magnetic core and the extremely excellent effect of discriminating signal from noise, excellent commercial value and attaching operability are obtained.

DETAILED DESCRIPTION OF THE PREFERRED EMBODIMENTS

Explanation will be given for the first embodiment of the present invention based on the drawings as follows.

Figure 1:
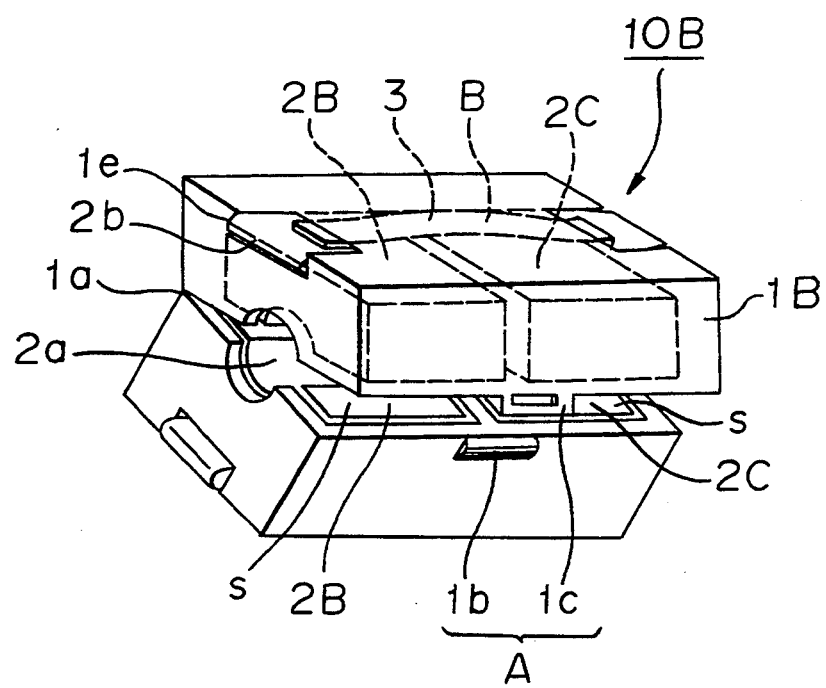
FIG. 1 is an explanatory perspective construction diagram showing a first embodiment of a signal discriminator according to the present invention.
Figure 2:
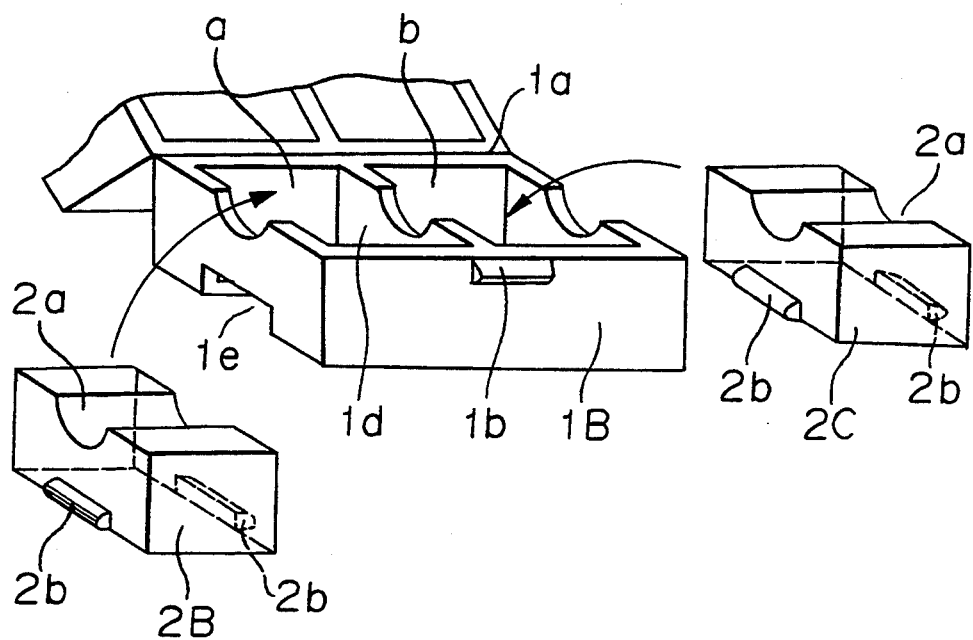
FIG. 2 is an exploded perspective diagram of parts of the signal discriminator of the first embodiment.

FIG. 1 is an explanatory perspective construction diagram showing the first embodiment of a signal discriminator according to the present invention, and FIG. 2, an exploded perspective view of parts of the signal discriminator of the first embodiment.

The same or the corresponding portion as in the first conventional example is designated by the same notation.

In FIGS. 1 and 2, a notation 1B designates a synthetic resin case (hereinafter case), 1a, a hinge capable of opening and closing the case 1B, 1b, a latch protrusion integrally provided with the case 1B capable of opening and closing at one side thereof, and 1c, a latch integrally provided at the other side of the case 1B, for latching both sides of the case 1B, by engaging with the latch protrusion 1b when the case 1B is closed. The latch protrusion 1b and the latch 1c constitute a latch means A. The latch 1c is of a construction capable of arbitrarily releasing the latching. A notation 1d designates a partition plate which divides the inner portion of the case 1B in two sections, a and b, sections partitioned by the partition plate 1d, and 1e, a cut-off portion for engaging with the accommodated magnetic core. Notations 2B and 2C designate respectively dual divided cores (hereinafter, cores) of different characteristics having semicircular attaching grooves 2a for inserting a cable, not shown, and protrusions 2b for engaging with the cut-off portion 1e of the case 1B, and 3, wavy flat springs for composing a press-contacting means B which are interposed and retained between the back faces of the cores 2B and 2C, and the bottom faces of the sections a and b of the case 1B. These flat springs 3 press the cores 2B and 2C by latching the latch means A, thereby respectively and mutually press-contacting divided faces s.

Explanation will be given to the operation based on the above construction.

In FIG. 2, first, the cores 2B and 2C are respectively accommodated in the sections a and b partitioned by the partition plate 1d of the case 1B. The cores 2B and 2C are retained in the case 1B by engaging the respective protrusions 2b of the cores 2B and 2C with the cut-off portions 1e of the case 1B. At this occasion, the wavy flat springs 3 are previously interposed between the back faces of the cores 2B and 2C and the bottom faces of the sections a and b, thereby retaining the flat spring 3.

Next, a wire, not shown, is attached to the semicircular attaching grooves 2a of the cores 2B and 2C, the case 1B is closed with the hinge 1a as a fulcrum, and the latch protrusion 1a is engaged with the latch 1b by pressing both sides of the case 1B, thereby latching both sides of the case 1B. At this occasion, the flat springs 3 are pressed by the bottom faces of the sections a and b, and press the back faces of the cores 2B and 2C by the spring force, and uniformly press-contacts the divided faces s of the cores 2B and 2C by a required pressing force when the latching is finished.

In this way, since there will be no gap between the divided faces s, and a stable press-contacting state is always maintained, an effective discrimination of signal from noise is performed by the extremely stabilized signal discriminating action.

Figure 4:
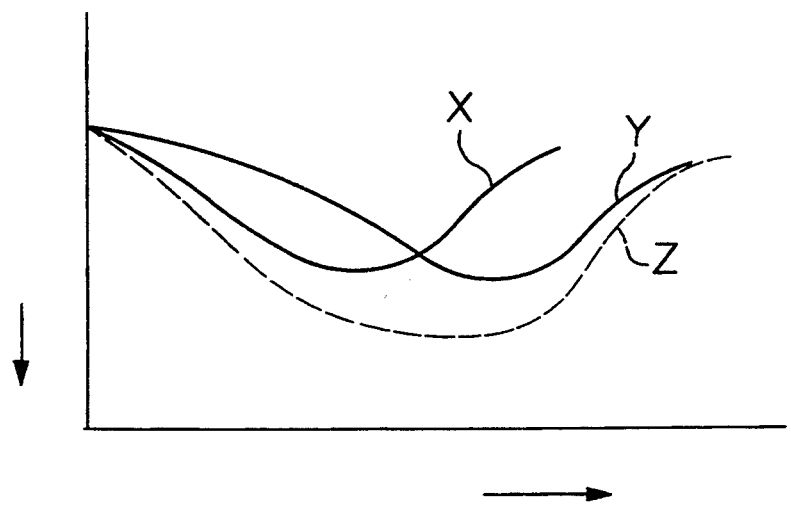
FIG. 4 is a noise attenuation characteristic diagram of a composite magnetic core.
Figure 5:
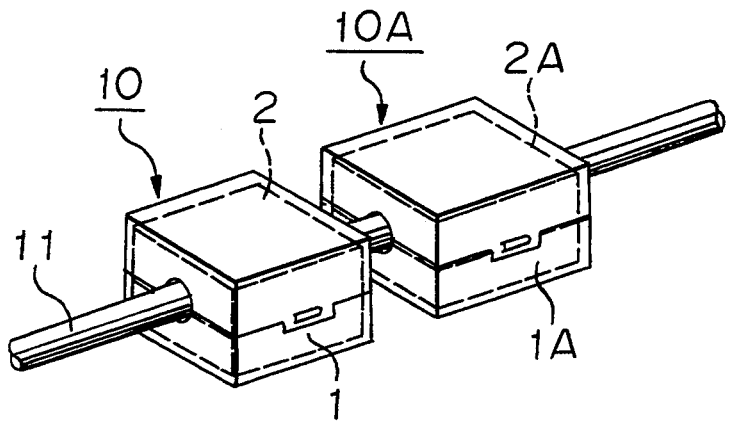
FIG. 5 is an as attached appearance perspective diagram of a first conventional examples of a composite signal discriminator.

At this moment, since the cores 2B and 2C having different characteristics are provided in series in the case 1B, an excellent noise attenuation can be realized over a wide band frequency as shown in the composite attenuation characteristic of FIG. 4, as described above.

Furthermore, it is possible to exchange the cores 2B and 2C arbitrarily with required cores having different characteristics when they are used. Since the noise attenuation characteristic depends on a permeability frequency characteristic, a signal discriminator having a required noise attenuation characteristic can easily be obtained by exchanging arbitrarily to magnetic cores having characteristics matched with the necessary noise attenuation characteristics. Accordingly, a signal discriminator having an optimum characteristic can easily be obtained by trial and error.

Furthermore, in the above embodiment, a case is shown wherein a square synthetic resin case is utilized. However, this invention is not restricted to this example, and the sectional shape may be circular or the like.

Figure 3:
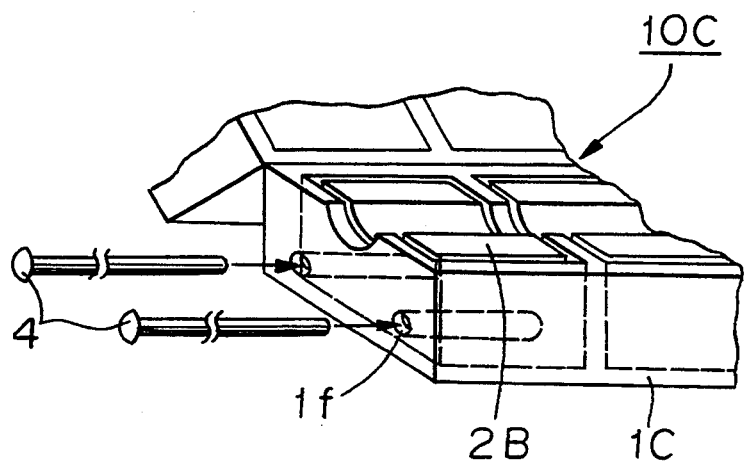
FIG. 3 is an exploded perspective diagram for important parts of a signal discriminator showing a second embodiment.

Furthermore, as a second embodiment of the present invention, the engaging and retaining structure between the dual divided magnetic cores and the synthetic resin case may be a combination of a retaining pin 4 and a retaining hole 1f of a case 1C of a synthetic resin case 10C as shown in FIG. 3.

Furthermore, it is naturally possible to obtain a signal discriminator having various characteristics by combining three sets or more of the magnetic cores having different characteristics.

As explained above, according to the present invention, plural sets of magnetic cores having different characteristics are accommodated in the same synthetic resin case capable of opening and closing, the case is closed and latched by the latch means, and the divided faces of the magnetic cores are always and uniformly press-contacted by the press-contacting means for pressing the magnetic cores by the latching. Accordingly, a signal discriminator can easily be obtained which has simple attachment capability which is provided with the required noise attenuation characteristic of a wide band.

In this way, a signal discriminator can be provided at a low price, wherein the conventionally scattered attaching places of signal discriminators are unified in one place, the number of parts thereof is reduced, and the attaching space is reduced.

A third embodiment of this invention will be explained based on the drawings as follows.

Figure 6:
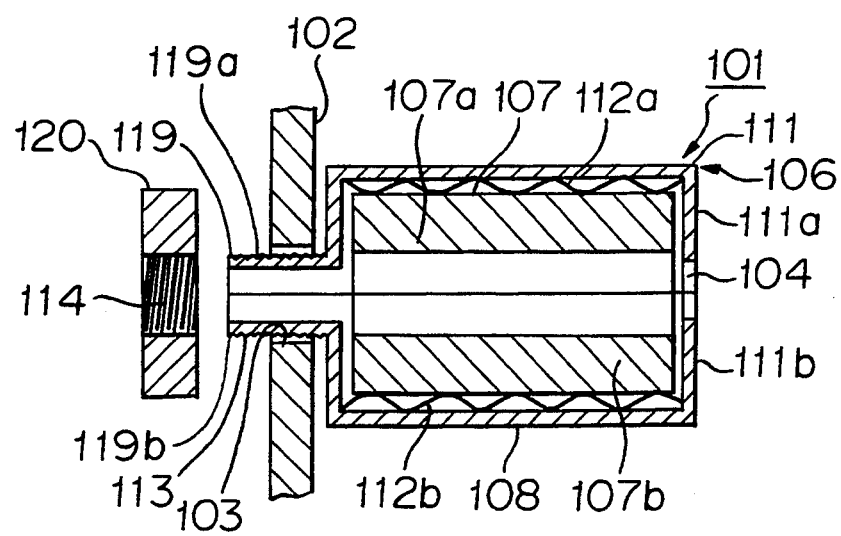
FIG. 6 is a sectional diagram showing a third embodiment of a signal discriminator.
Figure 7:
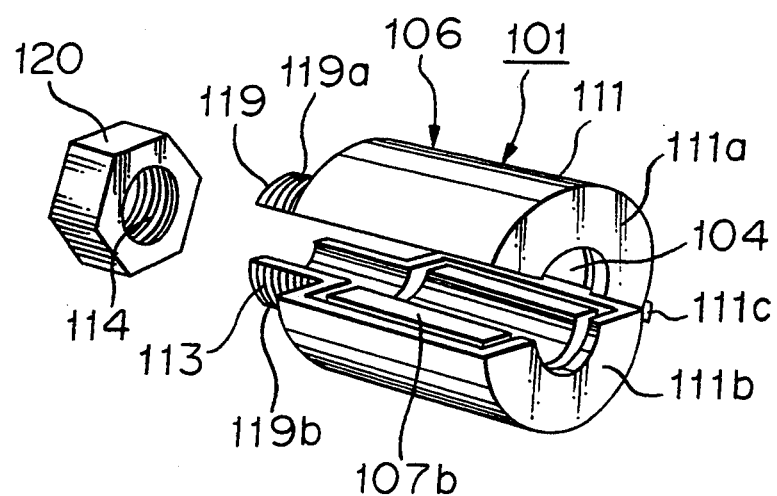
FIG. 7 is an exploded perspective diagram before attaching the third embodiment.
Figure 8:
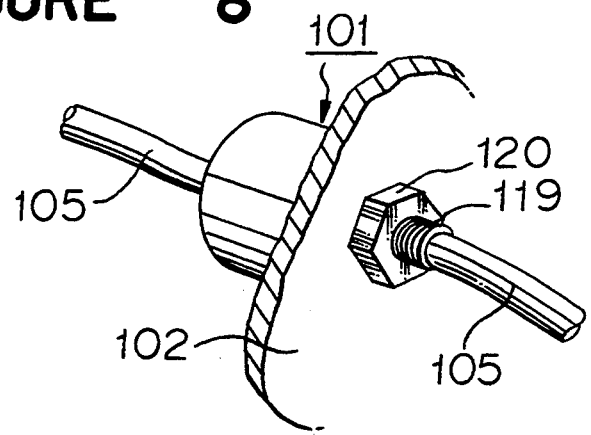
FIG. 8 is a perspective diagram showing an attached state of the third embodiment.
Figure 12:
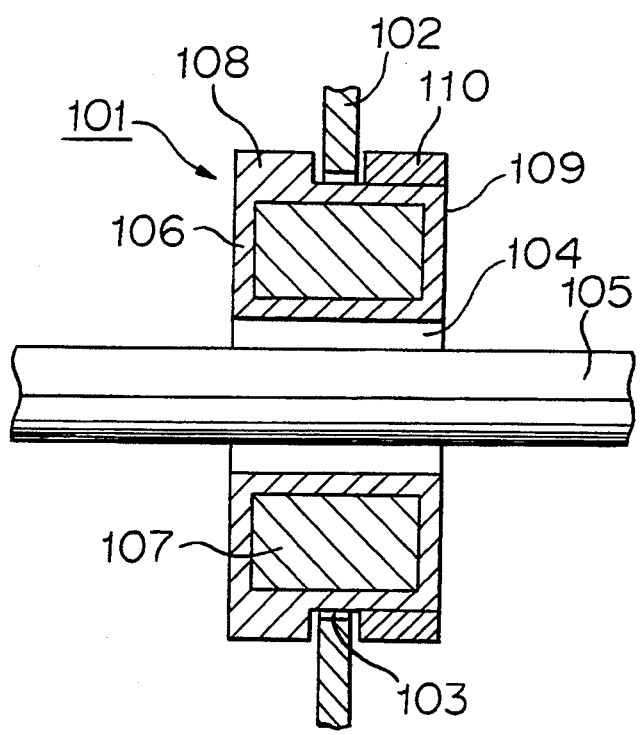
FIG. 12 is a sectional diagram showing a second conventional example of a signal discriminator.

FIG. 6 is a sectional diagram showing a third embodiment of a signal discriminator, FIG. 7, an exploded perspective diagram before attaching thereof, and FIG. 8, a perspective diagram showing an attached state thereof. In these Figures, the same notation as in FIG. 12 designates the same or the corresponding portion.

The main body of a signal discriminator 106 composing a signal discriminator 101, has a construction wherein a case 111 capable of opening and closing semi-cylindrical divided cases 111a and 111b by a hinge 111c, accommodates the magnetic core 107 composed of divided magnetic cores 107a and 107b, and press-contacting members 112a and 112b such as wavy flat springs. The divided magnetic cores 107a and 107b have a construction wherein the cylindrical magnetic core 107 composed of a magnetic body made of ferrite or the like is divided in a plural number along an axial line, which is integrated in a state wherein they are accommodated in the divided cases 111a and 111b.

Semicircular divided inserting portions 119a and 119b are protruded from ends of the divided cases 111a and 111b. An inserting portion 119 is formed by integrating them so that they surround a cable 105. The inserting portion 119 is of a size capable of passing through the attaching hole 103 of the panel 102, on which outer surface a male screw 113 is formed. A fixing member 120 is composed of a ring-like member such as a nut, on which inner periphery a female screw 114 is formed.

In the above signal discriminator 101, the cable 105 penetrates the attaching hole 103 of the panel 102 and the fixing member 120. When the case 111 is closed in a state wherein the divided magnetic cores 107a and 107b and the press-contacting members 112a and 112b are accommodated in the divided cases 111a and 111b, so that it surrounds the peripheral portion of the cable 105, the divided magnetic cores 107a and 107b are integrated so that they surround the cable 105, thereby forming the magnetic core 107.

In this occasion, when the inserting portion 119 which is integrated so that it surrounds the cable 105, is inserted into the attaching hole 103 of the panel 102, the fixing member 120 is attached by screwing from an opposite side of the panel 102, and the divided cases 111a and 111b are fixed to the panel 102 in the integrated state. In this way, divided faces of the divided magnetic cores 107a and 107b are press-contacted, a closed magnetic path is formed, and at the same time the signal discriminator 101 is attached to the panel 102.

When current flows in the cable 105 in this state, noise components thereof are removed and a necessary signal is discriminated in accordance with an impedance characteristic of the magnetic core 107. The smaller the gap between the divided faces of the divided magnetic cores 107a and 107b, the larger the noise removing effect. Accordingly, the press-contacting force can be changed by changing the press-contacting members 112a and 112b, in accordance with an electromagnetic characteristic required for the magnetic core 107.

The exchange of the divided magnetic cores 107a and 107b and/or the press-contacting members 112a and 112b, can be performed by removing the signal discriminator 101 by an operation reverse to the above-mentioned process. The re-attaching thereof is performed by the operation which is the same as above.

Since the signal discriminator 101 is attached to the attaching hole 103 of the panel 102 in a state wherein the cable 105 penetrates them, it has a function of a bush as well. Furthermore, the attaching and the exchange of the signal discriminator 101 can be performed even in a state wherein the cable 105 penetrates the panel 102. The attaching of the signal discriminator 101 and the press-contacting of the divided magnetic cores 107a and 107b can be performed simply by attaching the fixing member 120. Furthermore, it is possible to change the press-contacting force of the divided magnetic cores 107a and 107b in accordance with the electromagnetic characteristic of the magnetic core 107, and adjustment thereof can easily be performed. Since the male screw 113 is formed at the inserting portion 119 and a nut having the female screw 114 is utilized as the fixing member 120, the fixing can easily be performed by the screwing thereof.

Figure 9:
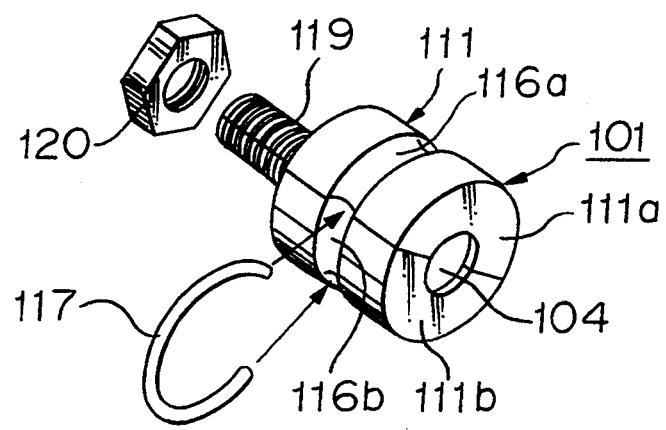
FIG. 9 is a perspective view of a fourth embodiment.
Figure 10:
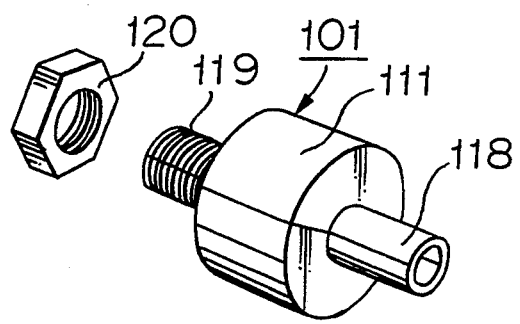
FIG. 10 is a perspective view of a fifth embodiment.
Figure 11:
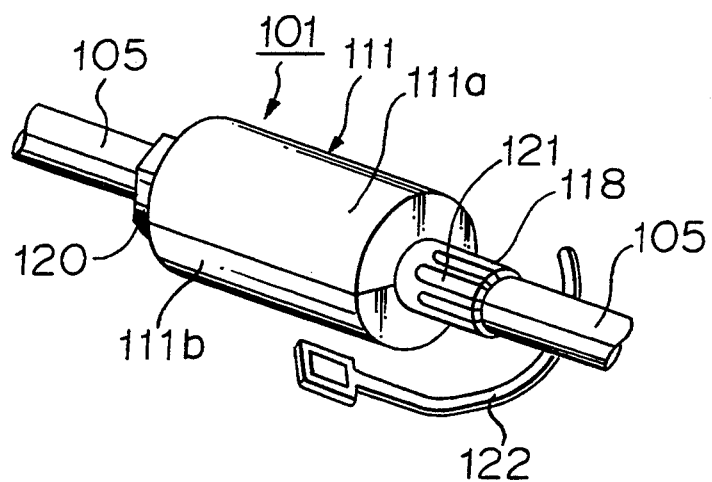
FIG. 11 is a perspective view of a sixth embodiment.

FIGS. 9 through 11 are perspective diagrams respectively showing fourth through sixth embodiments. In FIG. 9, engaging grooves 116a and 116b are formed at the divided cases 111a and 111b, and the fixing force of the divided cases 111a and 111b is enhanced by an auxiliary clip 117. In FIG. 10, a cable protecting portion 118 is formed in the case 111, for protecting the cable 105. In FIG. 11, slits 121 are further formed on the cable protecting portion 118, and fixing the cable 105 with the other end of the signal discriminator 101 is performed by fixing it by a tightening band 122.

In the above description, as the divided magnetic cores 107a and 107b, the ones having a shape of the divided cylindrical magnetic core 107 are shown. However, in case of attaching them to a flat cable, the shape can be chosen in accordance with the shape of the cable 105, such as utilizing divided ones of a magnetic core having a rectangular parallelepiped and a hollow portion.

Furthermore, the shape of the press-contacting members 112a and 112b is not restricted to a wavy flat spring, and may be otherwise. The fixing member 120 may be a clip or the like.

According to this invention, the divided magnetic cores and the press-contacting members are accommodated in the case capable of opening and closing composed of the divided cases. The case is closed, and the inserting portion is inserted into the attaching hole of the panel, and fixed by the fixing member. Therefore, the signal discriminator is provided with a function of a bush, and the attaching and the exchange of the signal discriminator can be performed even in a state wherein the cable penetrates the panel. It is possible to attach the signal discriminator and to press-contact the divided magnetic cores, simply by attaching the fixing member. Furthermore, the pressing force of the divided magnetic cores can be changed in accordance with the electromagnetic characteristic of the magnetic core.

Explanation will be given to seventh through ninth embodiments of this invention as follows.

Figure 13:
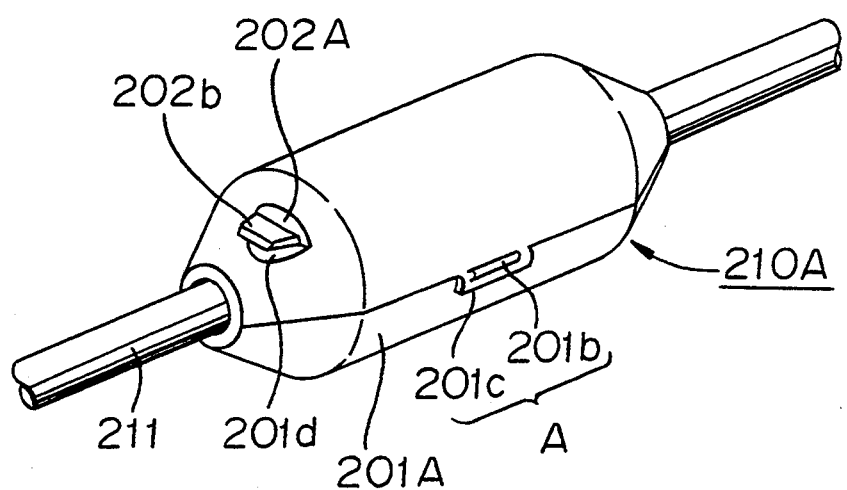
FIG. 13 is an appearance perspective diagram showing a seventh embodiment of a signal discriminator according to the present invention.
Figure 14A:
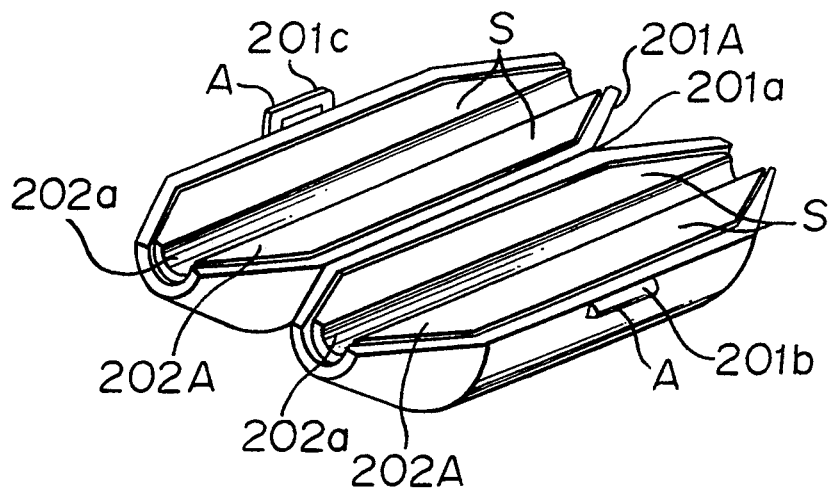
FIGS. 14(a) and 14(b) are exploded perspective diagrams of the seventh embodiment of the signal discriminator.
Figure 14B:
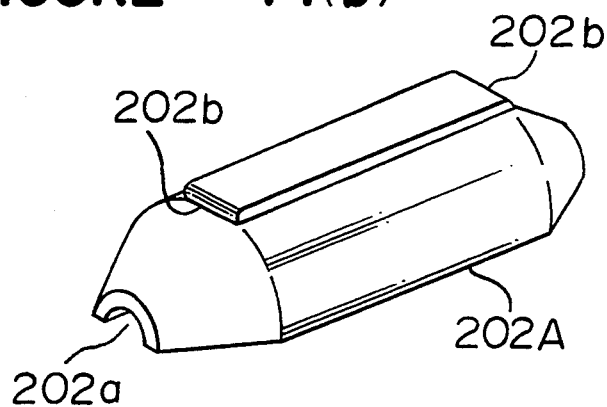
Figure 15:
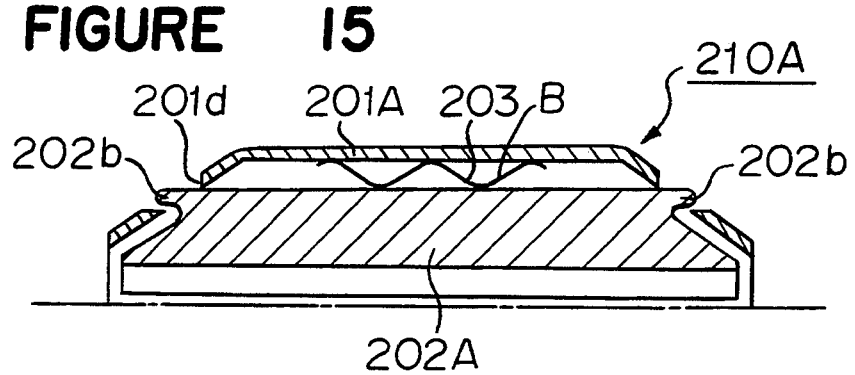
FIG. 15 is a sectional side view of the seventh embodiment of the signal discriminator.

FIG. 13 is an appearance perspective view showing a seventh embodiment of a signal discriminator of this invention, FIGS. 14(a) and 14(b), exploded perspective views of the seventh embodiment of a signal discriminator, and FIG. 15, a sectional side view of the seventh embodiment.

The same or the corresponding portion as in the third through the sixth conventional examples is designated by the same notation.

In FIGS. 13 through 15, a notation 201A designates a case made of a synthetic resin formed in a spindle shape, 201a, a hinge connected to the case 201A capable of opening and closing the case, a notation A, a latch means for latching both side ends of the case 201A when the case 201A is closed, composed of a latch protrusion 201b provided at a side end of a divided one of the case 201A having a dual divided construction, and a latch 201c provided at a side end of the other divided one of the case 201A for engaging with the latch protrusion 201b. A notation 202A designates dual divided magnetic cores (hereinafter cores) divided vertically and having a shape of a spindle, wherein semicircular attaching grooves 202a for attaching a cable 211, and protrusions 202b provided at back faces thereof for engaging with engaging holes 201d provided at the case 201A, are formed. A numeral 203 designates wavy flat springs composing a press-contacting means B provided at the inner face of the case 201A, which are previously interposed and retained between the inner face of the case 201A and the back face of the core 202A. A notation S designates divided faces of the core 202A.

Explanation will be given to the operation based on the above construction.

First, a required portion of the cable 211 is inserted between the attaching grooves 202a of the core 202A. The case 201A is closed by bending of the hinge 201a, and pressed so that the latch protrusion 201b and the latch 201c are completely engaged and latched. At this moment, the flat springs 203 press the back face of the core 202A by the spring resilience, and the divided faces S of the cores 202A are press-contacted. When the latch protrusion 201b and the latch 201c are latched, the flat springs 203 uniformly press-contact the divided faces S of the cores 202A always by a predetermined press-contacting force. Accordingly, there will be no gap between the divided faces S, and the cores 202A are always maintained to press-contact each other stably.

Since in the third conventional magnetic core, the end faces thereof are circular or square planes perpendicular to the longitudinal direction thereof, the shape of the case capable of opening and closing has to be in the same shape. Furthermore, in the mold-formed products of the fourth through sixth conventional examples, wasteful spaces have to be provided to get rid of a strange feeling, that is, to promote the commercial value. However, by making the shape of the core 202A a spindle-like shape, the discrimination of signal from noise can extremely effectively be performed, since the noise/signal discriminating effect is proportional to core sectional area x length. Furthermore, the attaching thereof is extremely easy, excellent in the operability, and the appearance thereof has an excellent commercial value.

Figure 16:
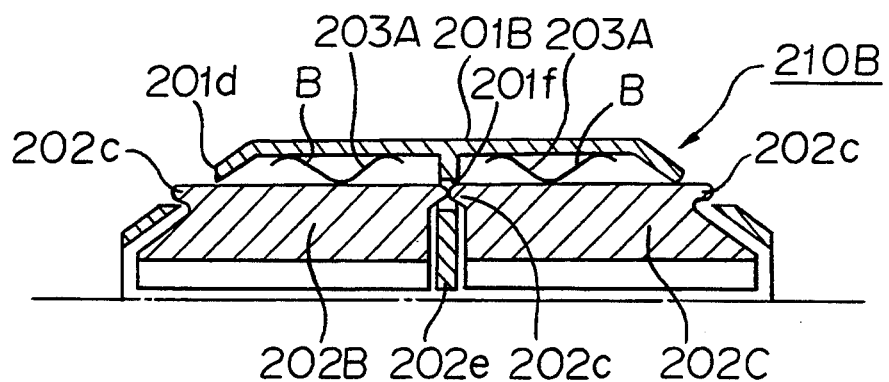
FIG. 16 is a sectional side view showing an eighth embodiment of a signal discriminator.

Next, FIG. 16 shows a sectional side view of an eighth embodiment of a signal discriminator of this invention.

In FIG. 16, a notation 201B designates a case made of a synthetic resin of a signal discriminator 210B, and 202e, a partition integrally formed with the case 201B at the central portion, having an engaging hole 201f for engaging with engaging protrusions 202c protruded at vertical end faces of magnetic cores (hereinafter, cores) 202B and 202C divided in two in a longitudinal direction thereof by the partition 202e, having a semi-spindle shape and respectively having different characteristics. A notation 203A designates wavy flat springs composing a press-contacting means B.

The same or the corresponding portion as in the above seventh embodiment is designated by the same notation.

The above construction is the same as in the seventh embodiment except that the cores 202B and 202C are opposedly provided interposing the partition 201e in the longitudinal direction, and a detailed explanation will be omitted. The noise attenuation characteristic in this case is, as in FIG. 4, as shown by an attenuation curve in a dotted line of Z which is combined with a noise attenuation curve X of the core 202B and a noise attenuation curve Y of the core 202C. Therefore, a signal discriminator can be obtained which is provided with a high attenuation characteristic over a wide band and an excellent appearance.

Figure 17:
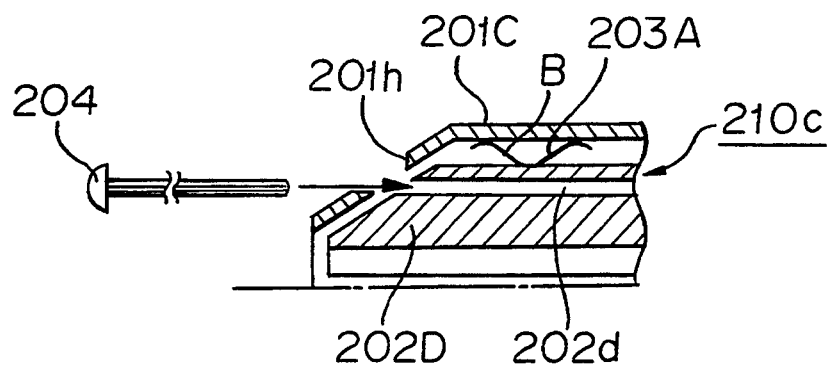
FIG. 17 is a sectional side view of exploded parts showing a ninth embodiment.
Figure 18:
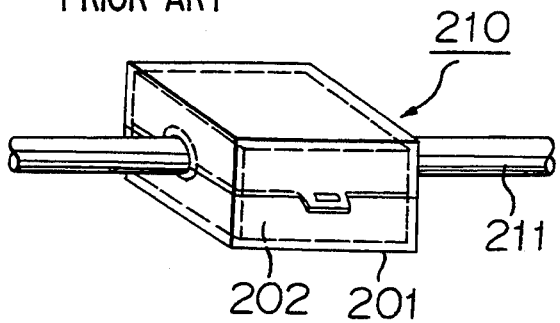
FIG. 18 is a construction appearance perspective view showing a third conventional example of a signal discriminator.
Figure 19:
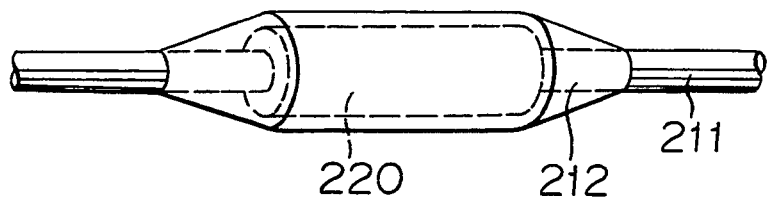
FIG. 19 is a construction appearance perspective view showing a fourth conventional example of a signal discriminator.
Figure 20:
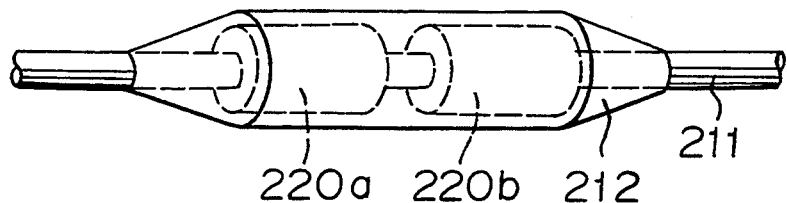
FIG. 20 is a construction appearance perspective view of a fifth conventional example of a signal discriminator.
Figure 21:
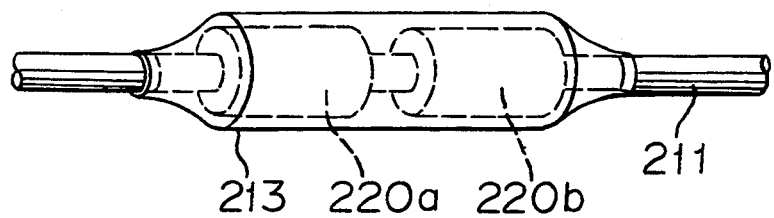
FIG. 21 is a construction appearance perspective view of a sixth conventional example of a signal discriminator.

Furthermore, the engaging means for engaging the core 202A with the case 201A is not restricted to the engaging protrusion 202c. As shown in a ninth embodiment of FIG. 17, it may have a construction wherein a retaining pin 204 is inserted to a retaining hole 201h and a hole 202d bored in the magnetic core 202D from outside of the case 201C, thereby retaining the magnetic core 202D in the case 201C.

As explained above, according to this invention, the dual divided magnetic cores having a spindle shape are accommodated in the case made of a synthetic resin having the hinge and the latch means. The case is closed and latched by the latch means. The divided faces of the magnetic cores are uniformly press-contacted by the press-contacting means interposed and retained between the case and the magnetic cores. Furthermore, a plurality of sets of magnetic cores having different characteristics, are accommodated in the same case. Accordingly, a signal discriminator can be obtained at a low price, of which noise/signal discriminating effect is extremely high over a wide band, easy in the attaching and detaching thereof, excellent in the attaching operability, and provided with a high commercial value.

What is claimed is:

1. A signal discriminator comprising:

a plurality of sets of dual divided magnetic cores having different magnetic characteristics, each of said magnetic cores including at least one protrusion portion;

a case made of a synthetic resin having a hinge capable of opening and closing the case, and a latch means, wherein an inner portion of said case is divided into a plurality of sections by a plurality of partition plates, said sections respectively accommodating the plurality of sets of dual divided magnetic cores, said case including at least one cut-off portion formed in each of said plurality of partition plates so that each magnetic core can engage said case through an interlocking engagement between said cut-off portion formed in each of said partition plates and each of the protrusion portions of said magnetic cores, respectively; and press-contacting means interposed and retained between the case and the plurality of sets of dual divided magnetic cores, which press the plurality of sets of dual divided magnetic cores when the case is closed and latched by the latch means, thereby uniformly press-containing respective divided faces of the plurality of sets of dual divided magnetic cores.

* * * * *